United States Patent [19]

DoMinh et al.

[11] Patent Number: 4,871,844
[45] Date of Patent: Oct. 3, 1989

[54] DIAZEPIHIUM DYES

[75] Inventors: Thap DoMinh; Donald R. Diehl, both of Rochester, N.Y.

[73] Assignee: Eastman Kodak Company, Rochester, N.Y.

[21] Appl. No.: 43,396

[22] Filed: Apr. 28, 1987

Related U.S. Application Data

[62] Division of Ser. No. 799,893, Nov. 20, 1985, Pat. No. 4,668,606.

[51] Int. Cl.$^4$ ............................................. C07D 243/08
[52] U.S. Cl. ..................................... 540/575; 540/559; 560/19; 548/203; 548/518; 564/511; 564/271; 564/279
[58] Field of Search .................. 540/575, 559; 560/19; 548/203, 518; 564/511, 271, 279

[56] References Cited

U.S. PATENT DOCUMENTS 1,878,557  9/1932  Wahl ................................... 564/279
2,211,408  8/1940  Dieterle et al. ...................... 260/240
3,288,784  11/1966 Speziale et al. ..................... 564/279
3,369,904  2/1968  Faber ................................... 96/102
3,627,527  12/1971 Gilman et al. ......................... 96/1.6

FOREIGN PATENT DOCUMENTS 119831  9/1984  European Pat. Off. .
509383  8/1971  Switzerland ..................... 564/279

OTHER PUBLICATIONS

Guertler and Dahne, "Electrochemical Studies on Polymethine Dyes", Z. Phys. Chem. (Leipzig), 1974, 255(3).
Sheves and Friedman, "Effect of External Negative Charge on Absorption Maxima of Symmetrical Cyanines", Angew. Chem. 1986, 98(3), 260-1, (Ger.).
Derwent Belgian Patents Report No. 9/67, p. 2:1 (4--3-67), Abstracting Belg. 685931.
Sveshnikov and Stokovskaya, Soviet Inventions Illustrated, Oct., 1969, p. 5:12 (1966).
Nikolajewski, Dähne & Hirsch, "Vilsmier-Formylierung von Polyenaldehyden", Chem. Ber. 100, pp. 2616-2619 (1967).
Lloyd D. et al., Chem. Abstracts, vol. 86 (1977), Entry 120185m.
Grahn, W., Chem. Abstracts, vol. 86 (1977), Entry 155104m.
Lloyd, D. et al., Chem. Abstracts, vol. 87 (1977), Entry 4893n.
Cuthbertson, A. et al., Chem. Abstracts, vol. 97 (1982), Entry 38201g.
"Formation of Phenylpyridinium Chloride from 5-Anilino-N-phenyl-2,4-pentadienylideniminium Chloride. Kinetics in Basic Media", Journal of the American Chemical Society, vol. 92, No. 19, pp. 5641-5645, Sep. 23, 1970.

Primary Examiner—Mukund J. Shah
Assistant Examiner—Carol L. Cseh
Attorney, Agent, or Firm—William J. Davis

[57] ABSTRACT

Novel diazepinium compounds having the structural formula:

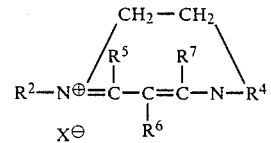

wherein $R^2$ and $R^4$ are individually alkyl of 3 to 7 carbon atoms $R^5$, $R^6$ and $R^7$ are individually H or alkyl; and $X^\ominus$ is an anion. The compounds are of the class of amidiniums, useful as dyes. The compounds are particularly useful in antireflective layers having unexpected thermal resistance for use in photoresist applications.

2 Claims, 2 Drawing Sheets

DIAZEPIHIUM DYES

This is a division of application Ser. No. 799,593, filed Nov. 20, 1985 now issued as U.S. Pat. No. 4,668,606.

FIELD OF THE INVENTION

This invention relates to antireflecting compounds and layers used with positive-working photosensitive layers, particularly those employed in processing semiconductor devices.

BACKGROUND OF THE INVENTION

A frequent problem encountered by resists used to process supports comprising semiconductor devices, is reflectivity back into the resist of the activating radiation by the substrate, especially those containing highly reflecting topographies. Such reflectivity tends to cause standing wave ripples and reflective notches, which interfere with the desired pattern in the photoresist. The notches are particularly bad when the support is non-planar. The conventional approach to this problem is to incorporate an anti-reflective dye either in the photosensitive layer or an adjacent layer.

Although there are many dyes known to be antireflective from their use as, e.g., antihalation dyes in the silver halide photography art, it is not possible to transfer such dyes wholesale to the photoresist arena. There are conditions peculiar to the photoresist art which render many such dyes unsuitable. One of these is the high temperature baking that is given to the resist, prior to its exposure. For example, it is common to force either the photoresist layer or the antireflective layer into a planar configuration by baking it until it melts and flows, creating a condition known as "planarizing." Such baking can require temperatures as high as 200° C. Unless care is taken in the selection of the dyes, such high temperatures are deleterious in at least two respects: First, because the antireflective layer is very thin, e.g., no greater than about 5 μm, the dyes tend to volatilize out of the layer, particularly if they are not so large in molecular weight as to be mordanted. Second, some of the dyes previously used in photography for antihalation are thermally unstable—that is, they bleach out when heated. Such bleaching is unsuitable when used with a resist, since the baking step described above would destroy the antireflective property before it can be used during the exposure step. An example of such bleachable dyes is the following dye, described in EPA 119,831:

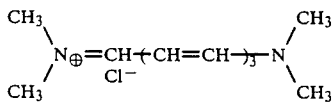

The mechanism of the bleaching of this dye is not explained, but it can be postulated to be similar to the electrocyclic ring closure of dyes of the type

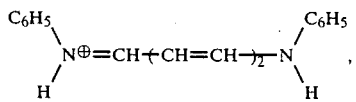

the ring closure mechanism of which is based on the presence of hydrogens in the mono-N-substitution, as described in J. Amer. Chem. Soc., Vol. 92, p. 5641-47 (1970).

SUMMARY OF THE INVENTION

This invention is based on the discovery that the composition of the invention, and particularly the novel dyes thereof, have unexpected superior thermal stability and resistance to volatilization while being heated to temperatures of at least 200° C.

More specifically, in accord with one aspect of the invention there is provided a positive-working, non-silver halide photosensitive element comprising a support, a layer on the support of a photosensitive compound responsive to activating radiation to provide increased solubility to selected solvents, and an antireflecting compound disposed in the layer or in a layer between said photosensitive layer and the support in an amount effective to absorb the activating radiation reflected from said support. The element is improved in that said antireflecting compound has the following structural formula:

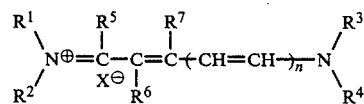

wherein
$R^1$, $R^2$, $R^3$ and $R^4$ are individually alkyl of 1 to 7 carbons atoms, or a carbocyclic or heterocyclic ring of at least 3 carbon atoms, or together $R^1$ and $R^2$, $R^3$ and $R^4$, $R^1$ and $R^3$ or $R^2$ and $R^4$ are the atoms necessary to complete a heterocyclic ring of at least 2 carbon atoms;

$R^5$, $R^6$ and $R^7$ are individually hydrogen or alkyl of 1–7 carbon atoms, or $R^5$ and $R^6$ together comprise the number of atoms needed to complete a ring of from 5 to 6 carbon ring atoms;

n is 0 or 1; and

X is an anion.

In accord with another aspect of the invention, there is provided a novel dye that has the aforesaid utility. The dye has the structural formula set forth above, except that $R^1$, $R^2$, $R^3$ and $R^4$, if not within a ring, individually comprise alkyl of from 3 to 7 carbon atoms.

Thus, it is an advantageous feature of the invention that an antireflecting layer is provided for a positive-working photosensitive element, using preferably the novel dyes of this invention, that can withstand the high heating conditions necessary for such an element.

It is a related advantageous feature of the invention that such an antireflecting layer can be provided even at small thicknesses no larger than 5 μm, without the absorbing dye being lost due to volatilization.

Another advantageous feature of the invention is that the antireflecting compounds provided by the invention can be selected to match the activating radiation commonly used with positive-working photoresists, namely a mercury light source.

Yet another related advantageous feature of the invention is that the preferred antireflecting compounds are transparent to other radiation commonly used in processing resists, namely the deep UV.

Other advantageous features will become readily apparent upon reference to the following description of the preferred embodiments, when read in light of the accompanying drawings.

DESCRIPTION OF THE PREFERRED EMBODIMENTS

The description which follows concerns usage of the preferred embodiments as, or with, a photoresist, over semiconductor supports. In addition, the invention is applicable as a thermally-resistant antireflecting layer whether or not the photosensitive compound is used as a photoresist or some other end usage such as optical recording, and whether or not the support includes semiconductor materials. Thus, as used herein "support" means any kind of substrate.

Figure 1:
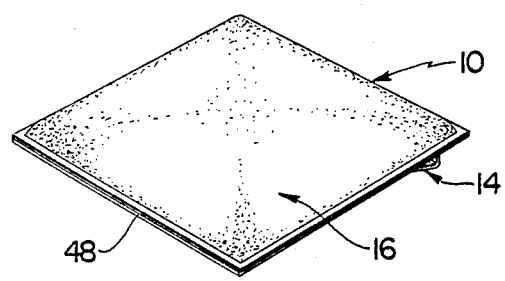
FIGS. 1 and 2 are fragmentary cross-sectional views of photosensitive elements prepared in accordance with the invention.

As noted, a preferred usage is with a photoresist layer 10, FIG. 1, comprising any positive-working photoresist composition that is coated onto a semiconductor support 12. Although the support is shown as being planar for simplicity, it is also useful with supports having non-planar features, particularly since resist layer 10 is commonly planarized under such conditions by heating it to 200° C. for a substantial length of time.

The antireflecting layer comprises, in this embodiment, a separate layer 14 disposed between support 12 and photosensitive layer 10. Preferably, layer 14 has a thickness no greater than "t", where t is 5 μm. The reason for this limitation is that for planarizing, layer 10 requires thinner underlayers. Additionally, if layer 14 were as thick as layer 10, development may undercut the images and lead to image lift-off. Therefore, most preferably layer 14 is considerably thinner than layer 10, and comprises the antireflecting compound and a suitable binder which must be imagewise removed with the exposed photoresist during development.

Figure 2:
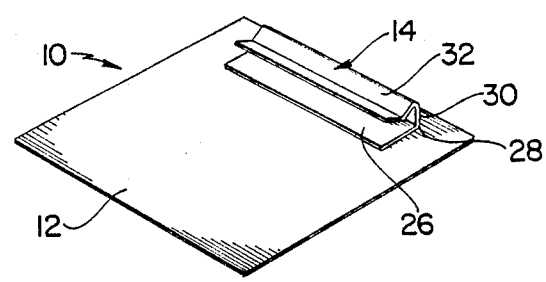

In FIG. 2, the two layers 10 and 14 have been combined into a single layer 24. As such, the binder for the photosensitive compound from layer 10 is all the binder that is needed for both the photosensitive compound and the antireflecting compound. The thickness of layer 24, like 14, preferably does not exceed about 5 μm.

As noted above, any positive-working photosensitive compositions are useful with the invention, particularly conventional compositions. Included here are polymethyl methacrylate resists and those featuring quinone diazide resins and compounds. Such resists are detailed in many publications, of which U.S. Pat. No. 4,365,019, issued on Dec. 21, 1982, is representative of the quinone diazide resists.

In accordance with one aspect of the invention, the antireflecting compound and the layer into which it is introduced, are rendered thermally stable by reason of the fact that the compound has the following structural formula:

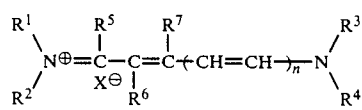

wherein $R^1$, $R^2$, $R^3$ and $R^4$ are individually alkyl of 1 to 7 carbon atoms, for example, methyl, n-propyl, isopropyl, butyl, hexyl, heptyl and the like; or a carbocyclic or heterocyclic ring of at least three carbon atoms, for example, cyclopropyl, cyclobutyl, cyclopentyl, cyclohexyl, cycloheptyl, phenyl, substituted-phenyl, thiazole, pyridine, and the like; or together $R^1$ and $R^2$, or $R^3$ and $R^4$, or $R^1$ and $R^3$, or $R^2$ and $R^4$ are the atoms necessary to complete a heterocyclic ring of at least 2 carbon atoms, for example,

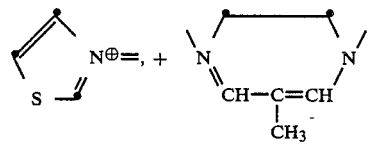

morpholine, piperidine, tetrahydroquinoline, pyrrolidine, and piperizine;

$R^5$, $R^6$ and $R^7$ are individually hydrogen or alkyl of 1 to 7 carbon atoms, for example, methyl, ethyl, n-propyl, isopropyl, butyl, hexyl, heptyl and the like, or together $R^5$ and $R^6$ comprise the atoms needed to complete a ring of from 5 to 6 carbon ring atoms, e.g., cyclopentyl, cyclohexyl, and the like;

n is 0 or 1; and

X is an anion.

Useful anions are those which impart solvent solubility to the dye, and representative examples include hexafluorophosphate; $CF_3CO_2-$; $CF_3SO_3-$; tetrafluoroborate; perchlorate; halides such as bromide, chloride, iodide; and the like.

The following are considered to be representative examples of specific useful antireflecting compounds for use in or with a photosensitive compound layer:

TABLE 1

$$\underset{R^2}{\overset{R^1}{\diagdown}} N^{\oplus} = \underset{X^-}{C} - \underset{R^6}{C} = C + CH = CH \xrightarrow{}_n N \underset{R^4}{\overset{R^3}{\diagup}}$$

| Compound | $R^1$–$R^4$ | $R^6$ | n | X | λ-max | E($10^4$) |
|---|---|---|---|---|---|---|
| 1 | all are n-butyl | H | 1 | $ClO_4$ | 418 | 12.9 |
| 2 | all are n-butyl | H | 1 | $PF_6$ | 417 | 12.5 |
| 3 | all are —$CH_3$ | H | 1 | $ClO_4$ | 411 | 11.6 |
| 4 | all are n-propyl | H | 1 | $ClO_4$ | 415 | 11.7 |
| 5 | together $R^1$ and $R^2$, as well as $R^3$ and $R^4$, form 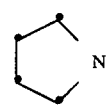 with the nitrogen | H | 1 | $ClO_4$ | 420 | 13.4 |
| 6 | all are n-butyl | H | 0 | $PF_6$ | 314 | 5.3 |
| 7 | $R^1 + R^3 = CH_2CH_2$ $R^2, R^4 = CH_3$ | H | 0 | $PF_6$ | 342 | 1.98 |
| 8 | $R^1 + R^3 = CH_2CH_2$ $R^2, R^4 = CH_3$ | $CH_3$ | 0 | $PF_6$ | 363 | 1.56 |
| 9 | $R^1 + R^3 = CH_2CH_2$ $R^2, R^4 = -CH_2CH_3$ | $CH_3$ | 0 | $PF_6$ | 365 | 1.70 |
| 10 | $R^1 + R^3 = CH_2CH_2$ $R^2, R^4 = $ n-propyl | $CH_3$ | 0 | $PF_6$ | 365 | 1.79 |

In the preceding table, $\lambda_{max}$ represents the wavelengths, in nm, of maximum absorption when measured in methanol, and E is the molar extinction coefficient of the compound. The $\mu_{max}$ values become particularly important when broadband control of multibanded activating radiation is desired, as is explained in greater detail hereinafter.

In addition to the preceding, the following are also considered to be examples of useful antireflecting compounds of the invention when used in or with a photosensitive layer (wherein "Ph" represents phenyl):

TABLE II $$R^1\underset{R^2/X^\ominus}{\overset{\oplus}{N}}\!\!\diagup\!\!\overset{CH}{\underset{}{}}\diagdown\overset{R^7}{\underset{R^6}{C}}\diagup\overset{CH}{\underset{}{}}\diagdown\overset{CH}{\underset{}{}}\diagup\overset{R^3}{\underset{R^4}{N}}$$

| Compound No. | R¹,R² | R⁴,R³ | R⁶ | R⁷ | X |
|---|---|---|---|---|---|
| 11 | (ring) | (ring) | CH₃ | H | ClO₄⁻ |
| 12 | CH₃, CH₃ | CH₃, CH₃ | CH₃ | H | ClO₄⁻ |
| 13 | CH₃, CH₃ | CH₃, CH₃ | H | CH₃ | ClO₄⁻ |
| 14 | (ring) | (ring) | H | CH₃ | ClO₄⁻ |
| 15 | CH₃, CH₃ | CH₃, CH₃ | H | CH₂CH₃ | ClO₄⁻ |
| 16 | (ring) | (ring) | H | CH₂CH₃ | ClO₄⁻ |
| 17 | Ph, CH₃ | CH₃, Ph | H | CH₂CH₃ | ClO₄⁻ |
| 18 | CH₃, CH₃ | CH₃, CH₃ | H | i-Propyl | ClO₄⁻ |
| 19 | (ring) | (ring) | H | i-Propyl | ClO₄⁻ |
| 20 | Ph, CH₃ | CH₃, Ph | H | H | BR⁻ |
| 21 | CH₃, CH₃ | CH₃, CH₃ | H | Ph | ClO₄⁻ |
| 22 | (ring) | (ring) | H | Ph | ClO₄⁻ |
| 23 | (ring) | (ring) | CH₃ | H | ClO₄⁻ |
| 24 | Ph, CH₃ | CH₃, Ph | H | Ph | ClO₄⁻ |
| 25 | p-CO₂EtPh*, CH₃ | CH₃, p-CO₂EtPh | H | CH₃ | ClO₄⁻ |
| 26 | p-CH₃COPh, CH₃ | CH₃, p-CH₃COPh | H | CH₃ | ClO₄⁻ |
| 27 | p-ClPh, CH₃ | CH₃, p-ClPh | H | CH₃ | ClO₄⁻ |
| 28 | p-BrPh, CH₃ | CH₃, p-BrPh | H | CH₃ | ClO₄⁻ |

*"Et" represents ethyl.

Of the antireflecting compounds of Tables I and II, the preferred ones are those wherein R¹ through R⁴, if they are not within a ring, comprise at least 3 carbon atoms, e.g., propyl, butyl, pentyl, hexyl, heptyl, and the branched chain analogs of these. The reason is that the longer chain alkyls have even less thermal loss than is the case when $R^1$, $R^2$, $R^3$ or $R^4$ are methyl or ethyl. That is, the degree of thermal stability achieved when $R^1$, $R^2$, $R^3$ and $R^4$ are just methyl was unexpected for n=2, compared to n=3. But the degree of improvement when $R^1$, $R^2$, $R^3$, $R^4$=alkyl of at least 3 carbon atoms, over methyl or ethyl, was even more unexpected.

The most preferred embodiments are such antireflecting compounds which totally lack aromatic groups, e.g., compounds 1–10 and 11, 12–16, 18–19, and 23. The reason is that the absence of aromatics makes the compound transparent to deep UV radiation, often used to process the semiconductor device being made with the resist. In contrast, the presence of aromatic groups tends to introduce absorbance at 256 nm, and the UV window is lost. For example, an additional, deep UV-sensitive poly(methyl methacrylate) (hereinafter, pmma) resist layer, not shown in the drawings, can be disposed *under* the antireflecting layer. In such a case, aromatic groups are undesired since they tend to block the activating radiation from reaching that lower resist layer.

The antireflecting compounds of this invention are readily synthesized using conventional practices. The following synthesis or di-n-butyl-(5-di-n-butylamino-2,4-pentadienylidene)ammonium perchlorate, compound No. 1 of Table 1, is illustrative:

Into a 500 mL round-bottom flask equipped with magnetic stirrer and addition funnel was placed 10.0 grams (0.036 mol) of 2,4-dinitrophenyl-1-pyridinium chloride and 75 mL methanol. Stirring was initiated, and when a homogeneous solution was attained, a solution of 15.7 g (20.4 mL, 0.122 mole) of di-n-butylamine in 50 mL methanol was added dropwise over 30 min at room temperature. The reaction mixture was stirred an additional 2 hr at room temperature, then was acidified by the addition of 10 mL 6N hydrochloric acid. After the addition of 25 mL H₂O, the precipitated 2,4-dinitroanilium chloride was filtered off. The filtrate was cooled to 0° C. and 25 mL of saturated aqueous sodium perchlorate was added. An orange oil separated out which spontaneously crystallized after stirring at 0° C. for 30 min. The product was filtered off, recrystallized from cold ethanol/water, and dried under vacuum at 80° C. overnight. Yield: 8.9 g (59%), bright yellow crystals, m.p.=85°–86° C., λ-max 418 nm (MeOH), ε-max 12.9×10⁴.

The pyridinium chloride salt used in the above synthesis was in turn prepared as follows:

2,4-*Dinitrophenyl-1-pyridinium chloride*-Literature Reference: A. F. Vompe, *Zuhr. Obschei. Khim,* 27, 3282–3290 (1957)

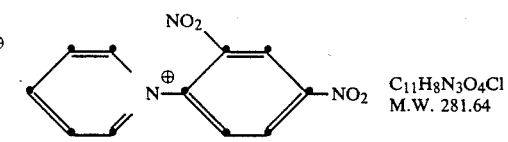

$C_{11}H_8N_3O_4Cl$
M.W. 281.64

Into a 500 mL round bottom flask equipped with a reflex condenser and mechanical stirrer was placed 80 g (0.396 mol) of 1-chloro-2,4-dinitrobenzene, 40 grams (0.506 mol) of pyridine, and 160 mL of acetone. The reaction mixture was stirred and heated at reflux for 6 hr. During this time a thick, off-white precipitate formed. The product mixture was cooled to room temperature and filtered. The product was washed with cold acetone and diethyl ether, then air dried. Yield: 78.9 g (70%), pinkish-white crystals, m.p. =201°-203° C.

An alternative scheme for synthesizing at least certain symmetric antireflecting dyes is the following reaction:

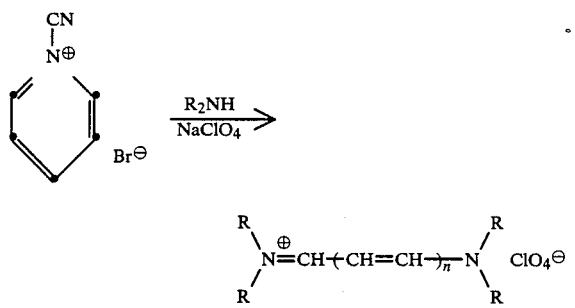

wherein n=2 and R is alkyl of from 1 to 4 carbon atoms.

As noted, if the aforesaid antireflecting compounds are used in a layer other than the layer comprising the photosensitive compound, a binder is included for the antireflecting compound. Conventional binders, for example, those used in photoresists, e.g., pmma and polyamic acid, are useful in such a layer.

The antireflecting compounds of this invention have demonstrated unexpected properties. Chief of these is the thermal stability when heated to 200° C., a condition common in the processing of positive-working photoresists to make semiconductor devices. Although the absence of ring closure would have been expected with the antireflecting compounds of this invention, in light of the aforesaid teaching of the article from Vol. 92 of the *Journal of the American Chemical Society*, the outstanding thermal stability of these antireflecting compounds was unexpected. That is, there are other reactions which could have caused degradation and a lose of absorptive capability upon heating, such as the reaction

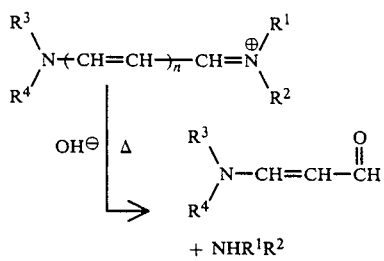

It was not until the antireflecting compounds of the invention were actually tested that their superior thermal stability was demonstrated. Also, surprising was that the ionized compounds of this invention resisted volatilization so well. That is, as is reported in detail hereinafter, these compounds are surprisingly much less volatile than a neutral dye of a comparable molecular weight.

EXAMPLES

The following examples further illustrate the scope of the invention.

EXAMPLES 1-3

Solutions of the antireflecting compounds listed in Table III below were prepared by dissolving each compound in a pmma-chlorobenzene solution so that the concentrations were 0.5% dye and 6% pmma (w/w). The solutions so prepared were filtered (0.5 μm) and spin coated on ×2 quartz plates at 3000 RPM to give a thickness of about 0.4 μm. The coatings were soft baked at 100° C. for 30 min in a force air convention oven to remove the solvent, followed by a hard bake at 200°/10 min which is usually required for planarization.

TABLE III

| Example | Antireflecting Compound |
| --- | --- |
| 1 | No. 1 from Table I |
| 2 | No. 2 from Table I |
| 3 | No. 3 from Table I |
| Comparative Ex. 1 | Sudan Orange G obtained from Aldrich Chemical Co. |
| Comparative Ex. 2 | Curcumin obtained from Eastman Kodak Co. |

Absorption spectra of the coating before and after the hard bake (200° C./10 min) showed that at the same concentration and the same thickness (a) Examples 1, 2, and 3 produced 2-4 X the density of the comparative examples at maximum absorption, (b) Examples 1-3 had *less* density in the deep UV window (200-300 nm) than did the comparative examples, and (c) heating at 200° C. has no effect on Examples 1, 2, and 3 whereas heating caused a complete disappearance of Comparative Example 1 and a significant decrease in dye density with Comparative Example 2.

EXAMPLE 4

BROAD-BAND CONTROL AT WAVELENGTHS OF MERCURY LIGHT SOURCES

To demonstrate the outstanding selectivity of this invention, the antireflecting compounds 6, 9, and 2 of Table I were dissolved in methanol at a concentration of $3.02 \times 10^{-5}$, $9.41 \times 10^{-5}$, and $1.28 \times 10^{-5}$ moles per liter, respectively. The combined solution was then checked for absorbancy, and the absorbancy curve of FIG. 3 was plotted. Of interest is the fact that the three λ-max peaks were of equal height and substantially matched the emitting wavelengths of the mercury light source, namely 313, 366 and 405/436 doublet. Also of interest is the substantial transparency this blend provided below 290 nm, for the deep UV.

EXAMPLES 5-8

ENHANCED THERMAL STABILITY

To demonstrate the further unexpected thermal stability of the novel antireflecting compounds of this invention, the R groups on the amino end portions were varied from $R=CH_3$, a known compound, to R =propyl and butyl. Solutions of the compounds noted in Table IV below were made as described for Example 1, and a 0.4 μm coating was made and heated at 200°C. for 1 hour. % density loss was measured as being indicative of thermal instability.

TABLE IV

| Example | Antireflecting Compound | $R^1$-$R^4$ | MW | % Density Loss |
| --- | --- | --- | --- | --- |
| 5 | No. 3 of Table I | $CH_3$ for all | 298 | 22 |
| 6 | No. 2 of Table I | n-butyl for all | 466 | 5 |
| 7 | No. 6 of Table I | n-butyl for all | 440 | 1 |

TABLE IV-continued

| Example | Antireflecting Compound | $R^1$-$R^4$ | MW | % Density Loss |
|---|---|---|---|---|
| 8 | No. 10 of Table I | $R^1$ & $R^3$ = —$CH_2$—$CH_2$—, $R^2$,$R^4$ = n-propyl | 340 | 1 |

Although Example 5 is still a useful example for an antireflecting layer admixed with or adjacent to a photoresist layer (since n = 2 rather than 3), the thermal stability is even further increased when there are at least 3 carbon atoms in at least two of $R^1$, $R^2$, $R^3$ and $R^4$. (Molecular weights are included because of the following comparative examples.)

COMPARATIVE EXAMPLES 3–7
RESISTANCE TO VOLATILIZATION

To further highlight the unexpected thermal stability of the invention, the antireflecting compounds of Examples 5–8 noted above, which are charged, can be compared with uncharged dyes of comparable molecular weights. The comparative examples of Table V below were dissolved in equal concentrations in pmma-chlorobenzene solution (0.5% dye and 6% polymer, w/w) and coated and heated as described for Example 5–8. Density loss was measured as before and is listed in the last column of Table V.

TABLE V

| Comp. Ex. | Dye Name | Structural Formula | MW | % Density Loss |
|---|---|---|---|---|
| 3 | bromocreosol purple | — | 540 | 75% |
| 4 | — | 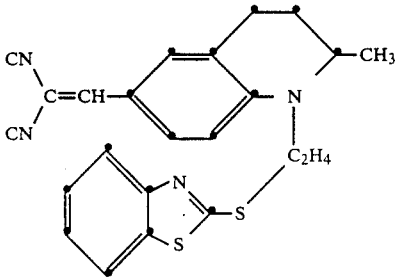 | 430 | 43% |
| 5 | — | 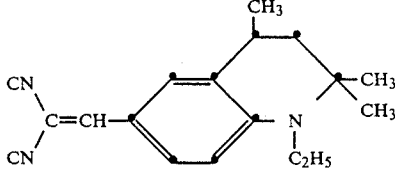 | 279 | 95% |
| 6 | curcumin | — | 368 | 60% |
| 7 | — | $(NC)_2C=CH-CH=CH-N(C_6H_{13})_2$ | 287 | 95% |

These high volatilization losses, for molecular weights ranging from 279 to 540, can be compared to the 22% or less loss for Examples 5–8 above, wherein the molecular weights ranged from 298 to 440.

The invention has been described in detail with particular reference to preferred embodiments thereof, but it will be understood that variations and modifications can be effected within the spirit and scope of the invention.

What is claimed is:

1. A diazepinium compound having the structural formula:

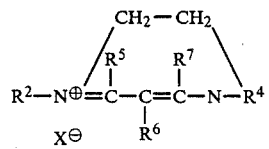

wherein $R^2$ and $R^4$ are individually alkyl of 3 to 7 carbon atoms, and $R^5$, $R^6$ $R^7$ and individually H or methyl; and X is an anion.

2. The diazepinium compound having the structural formula

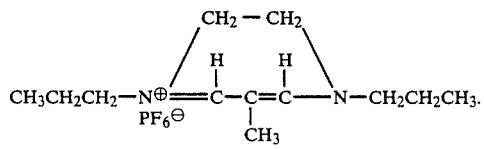

* * * * *

UNITED STATES PATENT AND TRADEMARK OFFICE
CERTIFICATE OF CORRECTION

PATENT NO. : 4,871,844

DATED : October 3, 1989

INVENTOR(S) : Thap DoMinh and Donald R. Diehl

It is certified that error appears in the above-identified patent and that said Letters Patent is hereby corrected as shown below:

On the title page, item [54], "DIAZEPIHIUM" should read --DIAZEPINIUM--.

Figure 3:
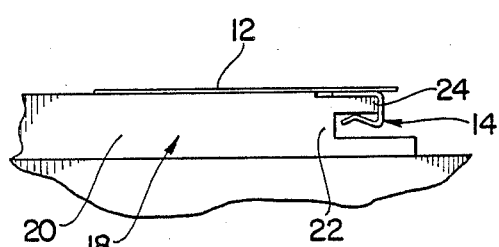
FIG. 3 is a plot of an absorbancy curve illustrating a use of the invention.
Figure 4:
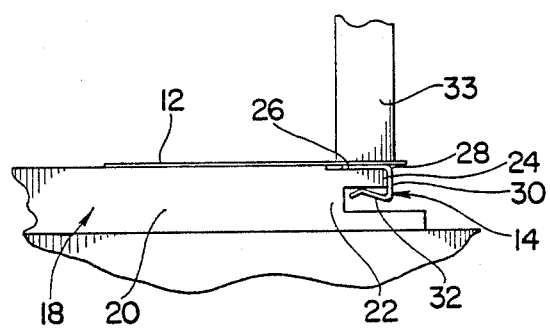
Figure 5:
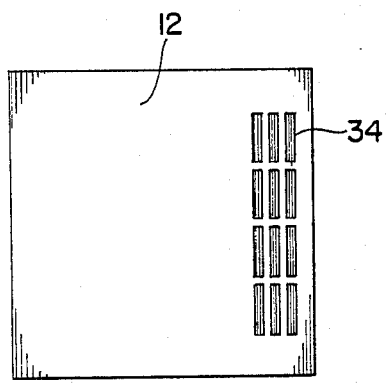
Figure 6:
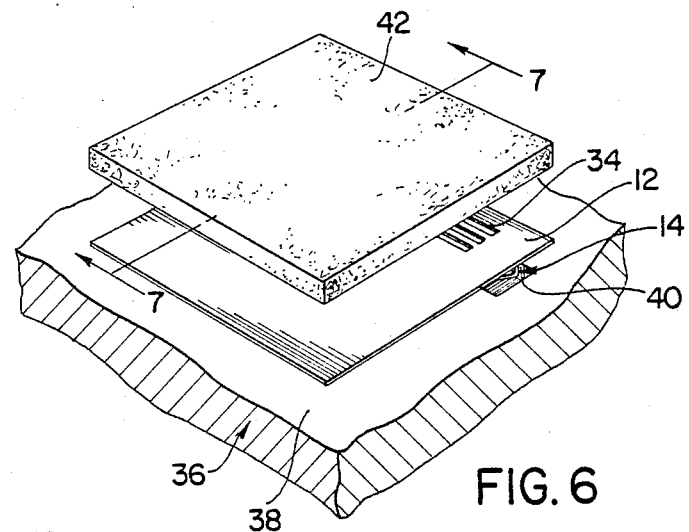
Figure 7:
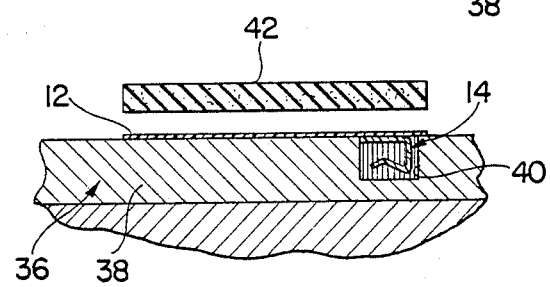
Figure 8:
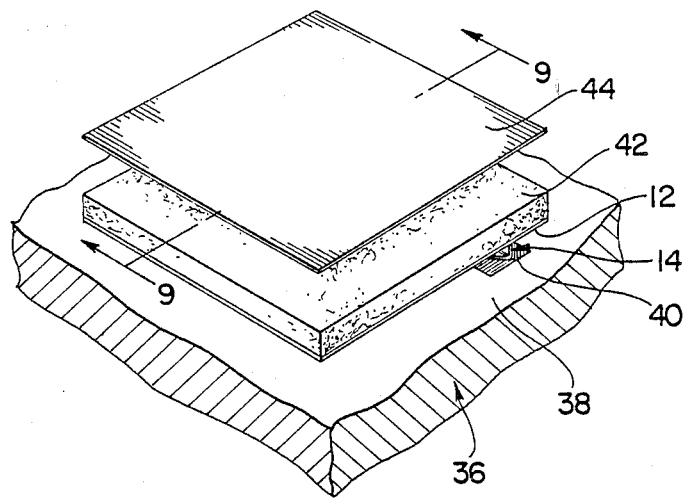
Figure 9:
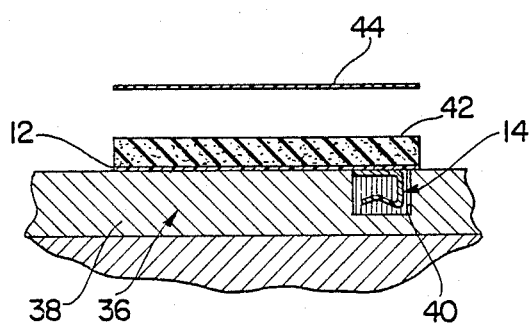
Figure 10:
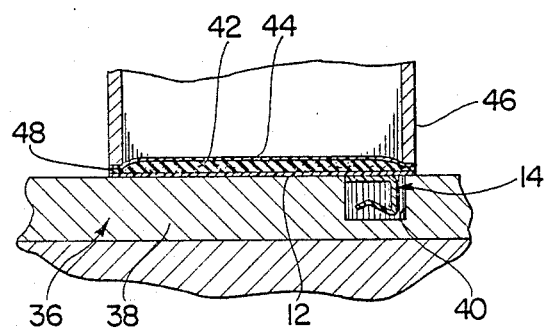
Figure 1:
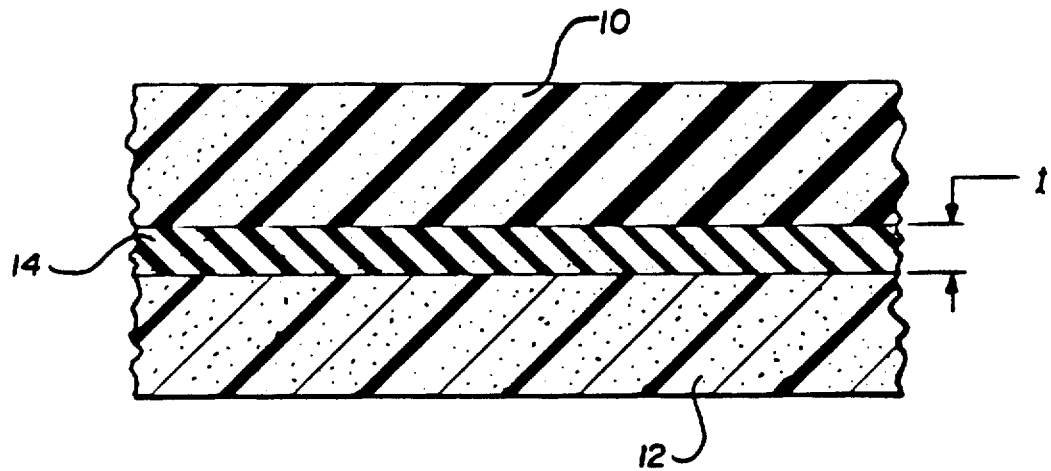
Figure 2:
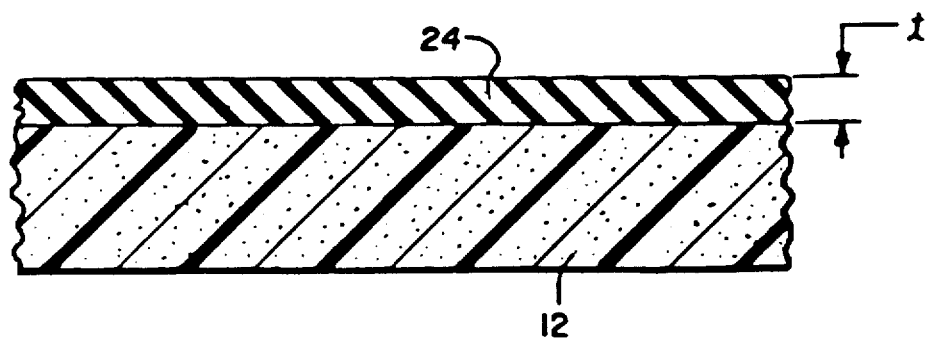
Figure 3:
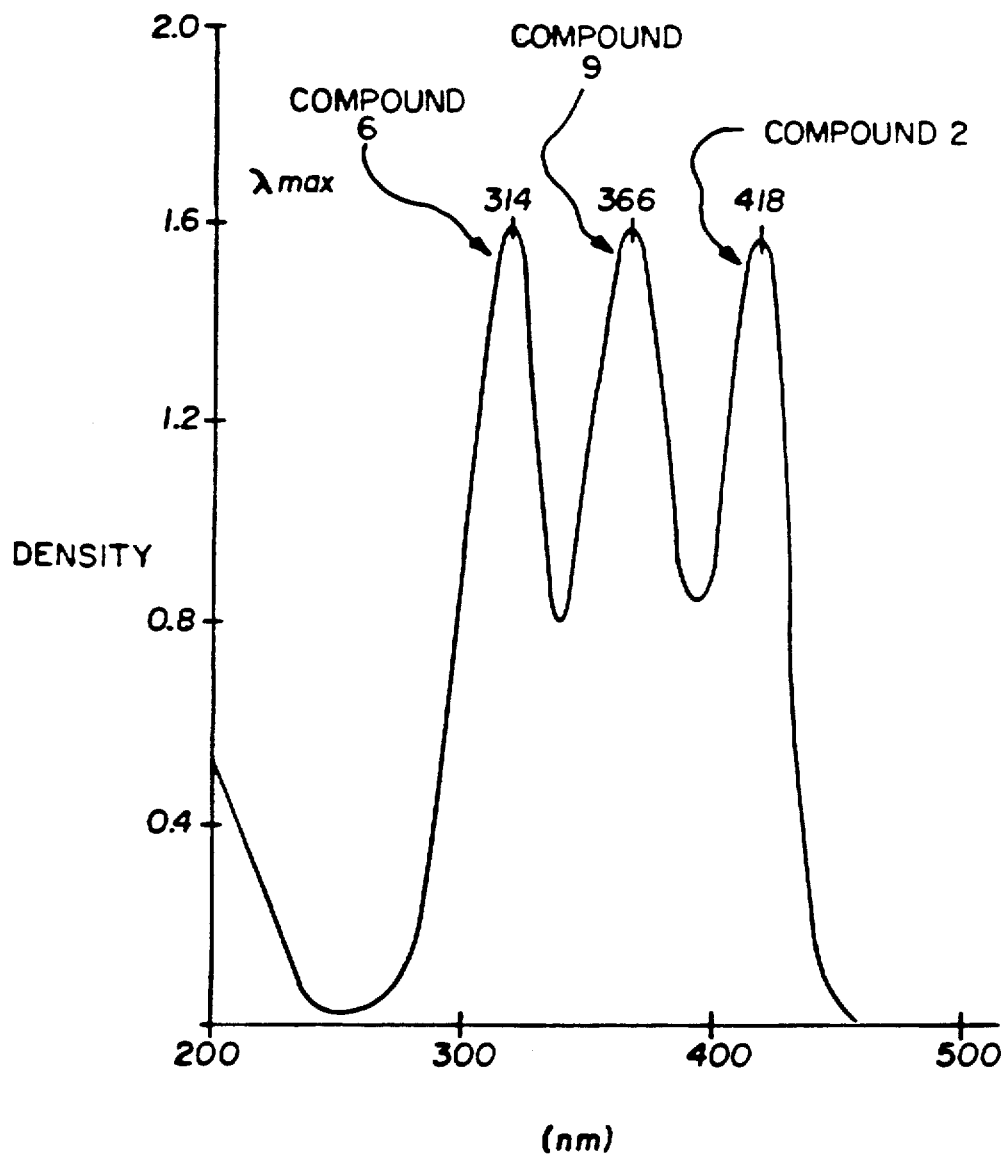

In the drawings, Figs. 1-10 should be replaced with Figs. 1-3 attached hereto.

Signed and Sealed this

Fifth Day of March, 1991

Attest:

HARRY F. MANBECK, JR.

Attesting Officer   Commissioner of Patents and Trademarks

UNITED STATES PATENT AND TRADEMARK OFFICE
CERTIFICATE OF CORRECTION

PATENT NO. : 4,871,844

DATED : October 3, 1989

INVENTOR(S) : Thap DoMinh and Donald R. Diehl

It is certified that error appears in the above-identified patent and that said Letters Patent is hereby corrected as shown below:

Title page, in the abstract and in claim 1, col. 10, the structural formula should read:

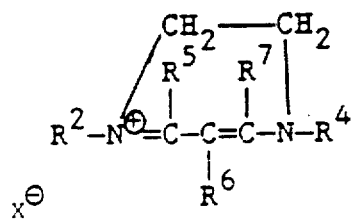

Signed and Sealed this

Fourth Day of February, 1992

Attest:

HARRY F. MANBECK, JR.

*Attesting Officer*          *Commissioner of Patents and Trademarks*